United States Patent
Lee

(10) Patent No.: US 7,037,836 B2
(45) Date of Patent: May 2, 2006

(54) METHOD OF MANUFACTURING A SEMICONDUCTOR DEVICE WITHOUT OXIDIZED COPPER LAYER

(75) Inventor: Han Choon Lee, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/733,276

(22) Filed: Dec. 12, 2003

(65) Prior Publication Data

US 2004/0121582 A1  Jun. 24, 2004

(30) Foreign Application Priority Data

Dec. 16, 2002  (KR)  ............. 10-2002-0080216

(51) Int. Cl.
*H01L 21/44* (2006.01)
(52) U.S. Cl. .............. 438/687; 438/633; 438/660
(58) Field of Classification Search ........ 438/687–688, 438/637–64, 622, 672–673, 691–69, 633
See application file for complete search history.

(56) References Cited

U.S. PATENT DOCUMENTS

| 6,090,701 | A | * | 7/2000 | Hasunuma et al. ......... 438/632 |
| 6,126,989 | A | | 10/2000 | Robinson et al. |
| 6,218,303 | B1 | * | 4/2001 | Lin ............................. 438/687 |
| 6,261,951 | B1 | | 7/2001 | Buchwalter et al. |
| 6,399,486 | B1 | | 6/2002 | Chen et al. |

* cited by examiner

*Primary Examiner*—Thanh Nguyen
(74) *Attorney, Agent, or Firm*—Pillsbury Winthrop Shaw Pittman LLP

(57) ABSTRACT

A semiconductor device which effectively reduces copper oxide layers on copper conductive lines is disclosed. The method includes forming a first insulating layer on a semiconductor substrate; forming a first conductive line by depositing a conductive material on the first insulating layer and selectively patterning the conductive material. A second insulating layer is deposited on top of the substrate including on the first conductive line. A via hole is formed by selectively patterning the second insulating layer to expose a certain portion of the first conductive line. A natural oxide layer is removed by plasma-processing the natural oxide layer using $H_2$+CO gas.

3 Claims, 4 Drawing Sheets

METHOD OF MANUFACTURING A SEMICONDUCTOR DEVICE WITHOUT OXIDIZED COPPER LAYER

CROSS REFERENCE TO RELATED APPLICATIONS

This application relates to and claims priority to Korean Patent Application No. 10-2002-0080216, filed on Dec. 16, 2002, the contents of which are incorporated herein by reference.

BACKGROUND OF THE INVENTION

1. Field of the Invention

The present invention relates to a method of manufacturing a semiconductor device and, more particularly, to a method of manufacturing a semiconductor device which effectively removes copper oxide layers on copper conductive lines.

2. Description of Related Art

It is generally known in the art to form a connecting portion as an electric connection between devices of a semiconductor apparatus by adapting a copper conductive line. This technology, however, has numerous drawbacks. A step from a surrounding portion of the connection is often enlarged; step coverage is lowered; and a short between the conductive lines is often caused which leads to low yield rates, since, after plug is formed in a contact hole or via hole of a second insulating layer, conductive line is formed on the plug.

In an attempt to resolve these problems, a Dual Damascene structure was developed that is formed by simultaneously patterning the plug and the conductive line. A copper conductive line adapted to the Damascene structure is advantageous from a point of resistance and reliability comparing with aluminum or aluminum alloy conductive line. The Dual Damascene process for forming the copper conductive line is performed as follows. A second insulating layer is formed on a lower conductive line, a certain portion of the second insulating layer is removed to form a via hole and a trench. A metal barrier is formed thinner on the via hole and the trench to get in contact with the lower conductive line. A copper layer is formed to completely fill the via hole and the trench. The copper layer is formed with a planarizing process and a cleaning process. A capping layer is formed to cover the exposed copper conductive line.

A method of forming a connecting portion and a conductive line of the semiconductor device according to the prior art will be now described with reference to FIGS. 1a to 1d.

A first insulating layer 102 is deposited on a semiconductor substrate 101 by a chemical vapor deposition (CVD) process. The semiconductor substrate 101 may be a semiconductor substrate with an impurity region (not shown), or a lower conductive line. A lower metal layer is then formed on the first insulating layer 102 by a sputtering method, etc. The lower metal layer is selectively patterned to form a first conductive line 103 using a series of photolithography and etching. Then, a second insulating layer 104 (such as an oxide layer, etc.) is deposited on the first insulating layer 102 and the first conductive line 103, as shown in FIG. 1a. A certain portion of the second insulating layer 104 is then etched and removed to form a via hole 105 and a trench 106 exposing the first conductive line 103. Through subsequent process, a second conductive line is formed in the trench 106 and a plug for connecting the first and second conductive lines is formed in the via hole 105.

A metal barrier 107, as sown in FIG. 1b, is formed on the second insulating layer 104 by a physical vapor deposition (PVD) process. A conductive layer 108 is then formed on the metal barrier 107 to sufficiently fill the via hole and the trench, as shown in FIG. 1c by CVD processing or a sputtering process. The conductive layer 108 may be composed of Al or Cu, etc. When the conductive layer is composed of Cu, a Cu seed layer (not shown) for forming a Cu bulk layer is formed on the barrier layer 107 by the PVD process, and the conductive layer (i.e., the Cu bulk layer 108) is formed in a thickness sufficient to fill the via hole 105 and the trench 106 by an electroplating process using the Cu seed layer. The Cu bulk layer 108 is then planarized to expose the surface of the second insulating layer 104, which forms a second conductive line 108a, an upper conductive line that is electrically connected with the first conductive line, and a plug 108b, a connecting portion between the first and second conductive lines, without a separate patterning process.

In the conventional method of forming the conductive line and the connecting portion of the conductive line of the semiconductor device, in a case where the conductive line and the connecting portion of the conductive line are formed using Cu, as described above, there is a problem in that a copper oxide layer (CuO) (i.e., a natural oxide layer) forms on the copper layer.

Taking a closer look at the generating point of the copper oxide layer, the generating point can be generally classified into the following three sections. The first generating point of the copper oxide layer occurs when the contact hole (or via hole 105) and the trench 106 are formed to expose the upper surface of the first conductive line 103 by the selective patterning of the second insulating layer 104 deposited on the first conductive line. The second generating point occurs when the metal barrier 107 is deposited in the via hole 105 and the trench 106 and the copper seed layer for forming the copper bulk layer 108 is formed on the metal barrier 107 so that the natural oxide layer is formed on the copper seed layer. The third generating point occurs when the conductive layer (i.e., the copper bulk layer 108) fills the via hole 105 and the trench 106 and the copper bulk layer 108 is planarized with the second insulating layer by CMP process so that the copper oxide layer is formed on the second conductive line.

In such Dual Damascene process using copper as described above, the generation of copper oxide layer cannot be avoided. To remove the copper oxide layer in the prior art, the copper oxide layer is removed by plasma-processing using a mixture of $H_2$ and Ar gas, or a mixture of $H_2$ and He gas, or by heat treatment in $H_2$ atmosphere.

The copper oxide layer formed on the copper seed layer causes a problem in that its formation thickness is so thin that the metal barrier 107 formed under the copper seed layer may be crystallized by the heat treatment at a high temperature, thus degrading the characteristics of the metal barrier.

The plasma treatment in the prior art also causes a thermal stress to be applied to the semiconductor substrate because the plasma treatment is performed at a temperature of above 300° C. Removing the copper oxide layer using heat-treatment under a hydrogen atmosphere is generally conducted at a temperature of about 150° C. This requires a fair amount of processing time to completely remove the copper oxide layer, thus causing the degradation of productivity of the semiconductor device.

U.S. Pat. No. 6,399,486, assigned to the Taiwan Semiconductor Manufacturing Company, discloses a method of resolving defects in the copper bulk layer that fills the via hole and the trench before performing CMP for the copper bulk layer. U.S. Pat. No. 6,399,486, however, does not disclose a solution for preventing or removing the various copper oxide layers described above.

BRIEF SUMMARY OF THE INVENTION

Accordingly, it is an aspect of embodiments of the present invention to solve the above-mentioned problems occurring in the prior art. It is another aspect of the embodiments of the present invention is to provide a method of manufacturing a semiconductor device, which effectively removes a copper oxide layer existing on a copper conductive line during process, in a connecting portion of an conductive line for the electric connection between devices of a semiconductor apparatus adapting the copper conductive line.

A method of manufacturing a semiconductor device is disclosed that includes forming a first insulating layer on a semiconductor substrate. A first conductive line is then formed by depositing a conductive material on the first insulating layer and selectively patterning the conductive material. A second insulating layer is formed by depositing an insulating material on top of the substrate including on the first conductive line. A via hole is then formed by selectively patterning the second insulating layer in order to expose a certain portion of the first conductive line. A natural oxide layer, formed on the first conductive line through natural oxidation of the first conductive line, is then removed by plasma-processing the natural oxide layer using $H_2$+CO gas or heat treating the layer in an $H_2$+CO atmosphere.

A method of manufacturing a semiconductor device is also disclosed that includes forming a first insulating layer on a semiconductor substrate. A first conductive line is formed by depositing a conductive material on the first insulating layer and selectively patterning the conductive material. A second insulating layer is formed by depositing an insulating material on top of the substrate including on the first conductive line. A via hole and a trench are formed by selectively patterning the interlayer dielectric as to expose a certain portion of the first conductive line. A metal barrier is formed by depositing a metal layer on top of the substrate including on the via hole and the trench. A copper seed layer is then formed on top of the metal barrier. A natural copper oxide layer, formed on the copper seed layer through natural oxidation of the copper seed layer is then removed by plasma-processing the natural copper oxide layer using $H_2$+CO gas or heat treating the layer in an $H_2$+CO atmosphere.

A method of manufacturing a semiconductor device is further disclosed that includes forming a first insulating layer on a semiconductor substrate. A first conductive line is then formed by depositing a conductive material on the first insulating layer and selectively patterning the conductive material. A second insulating layer is formed by depositing an insulating material on top of the substrate including on the first conductive line. A via hole and a trench are formed by selectively patterning the second insulating layer in order to expose a certain portion of the first conductive line. A metal barrier is formed by depositing a metal layer on top of the substrate including on the via hole and the trench. A conductive material for forming a conductive line is deposited on top of the substrate including on the metal barrier in order to sufficiently fill the via hole and the trench. A plug and a second conductive line is formed by planarizing the conductive material on the second insulating layer in order to expose the second insulating layer. A natural oxidation of the second conductive line through natural oxidation of the second conductive line is removed by plasma processing the natural oxide layer using $H_2$+CO gas or heat treating the layer in an $H_2$+CO atmosphere.

Accordingly, the natural oxide layer can be effectively removed by adapting a plasma-processing or heat treatment in an $H_2$+CO gas atmosphere.

BRIEF DESCRIPTION OF THE DRAWINGS

The invention will be described in conjunction with the following drawings in which like reference numerals designate like elements and wherein.

DETAILED DESCRIPTION OF THE PREFERRED EMBODIMENTS

Hereinafter, a preferred embodiment of the present invention will be described with reference to FIGS. 2a to 2d, which illustrate a method of manufacturing a semiconductor device.

Figure 1A:
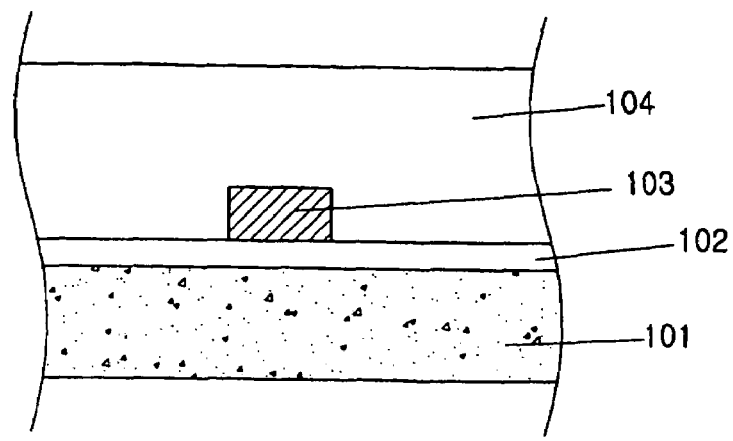
FIGS. 1a to 1d illustrate a method of manufacturing a semiconductor device of the prior art.
Figure 1B:
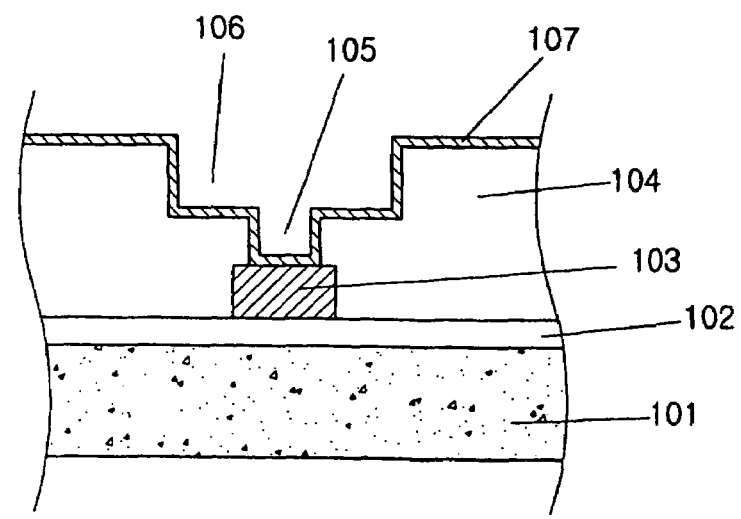
Figure 1C:
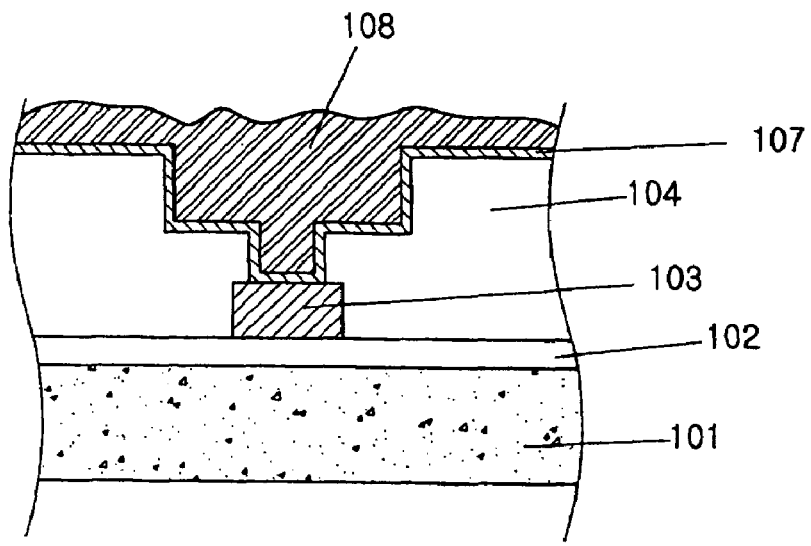
Figure 1D:
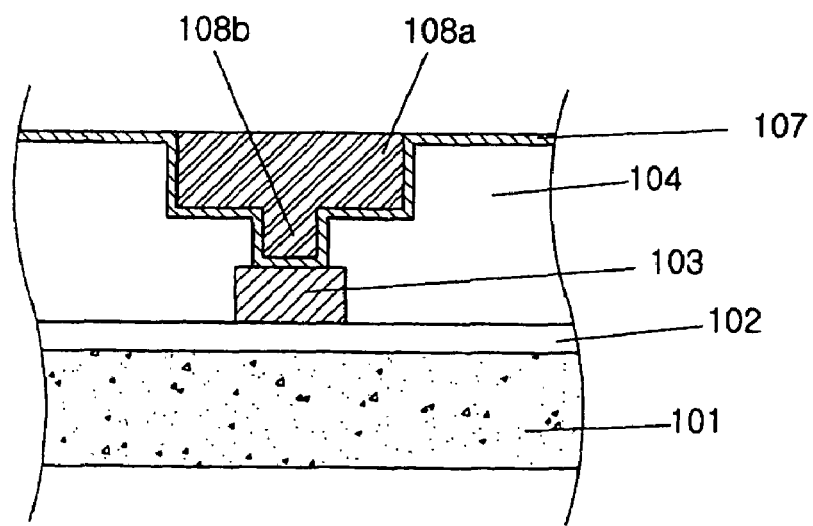
Figure 2A:
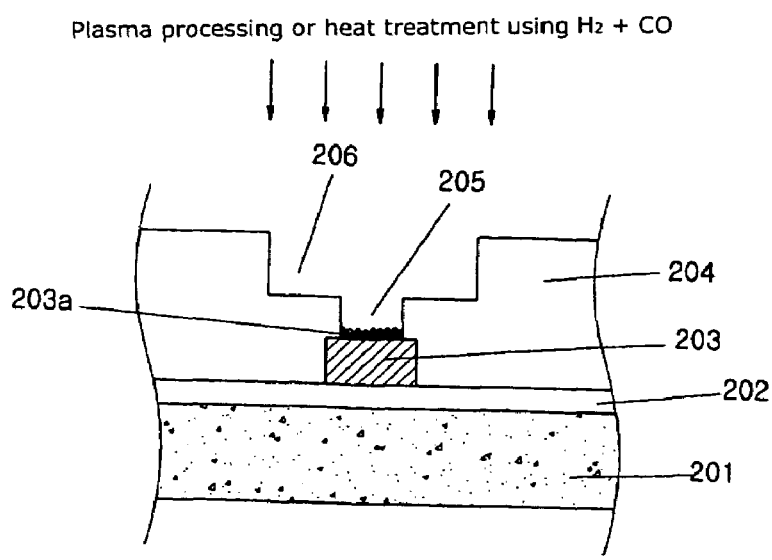
FIGS. 2a to 2d illustrate a method of manufacturing a semiconductor device according to the embodiments of the present invention.

As shown in FIG. 2a, a first insulating layer 202 is deposited on a semiconductor substrate 201 by a chemical vapor deposition (CVD) process. Herein, the semiconductor substrate 201 can be a semiconductor substrate with an impurity region (not shown), or a lower conductive line. A lower metal layer is then formed on the first insulating layer 202. This can be performed by a sputtering method, etc. The lower metal layer is selectively patterned to form a first conductive line 203 using photolithography and etching. Herein, the lower metal layer can be composed of copper.

A second insulating layer 204 is then deposited on the first insulating layer 202 and the first conductive line 203. The second insulating layer 204 can be composed of a Tetra Ethyl OrthoSilicate (TEOS) and a Spin On Glass (SOG), the major component of which is $SiO_2$.

A certain portion of the second insulating layer 204 is selectively patterned to form a via hole 205 exposing the first conductive line 203 and a trench 206. This can be performed by etching the second insulating layer 204 according to a pattern of a second conductive line. Through subsequent processing, the upper conductive line is formed in the trench 206 and a plug for connecting the first and second conductive lines is formed in the via hole 205.

The patterning of the via hole and the trench is performed by following procedure. A first hole corresponding to a portion of the via hole is formed by removing the second insulating layer 204 in a certain depth. At this time, a surface of the first conductive line should not be exposed by the first hole. An etching mask corresponding to a trench pattern is formed on the second insulating layer 204, and using the etching mask, the trench 206 is formed by dry-etching the second insulating layer 204. At this time, a part of the second insulating layer covering the first conductive line 203 is also etched, thus forming a via hole.

Herein, the etching of the second insulating layer 204 for forming the contact hole (or via hole) and the trench is performed by a dry-etching such as a reactive ion etching (RIE) by which a first copper oxide layer 203a, which is a byproduct of the dry etching is formed on the first conductive line 203, (i.e., the copper layer).

To remove the first copper oxide layer 203a on the first conductive line 203, plasma-processing using $H_2$+CO gas or a heat treatment using $H_2$+CO gas can be performed.

That is, the first copper oxide layer 203a on the first conductive line 203 can be removed by deoxidizing the first copper oxide layer 203a through plasma-processing using $H_2$+CO gas at room temperature or a heat treatment using $H_2$+CO gas at room temperature to 200° C.

Figure 2B:
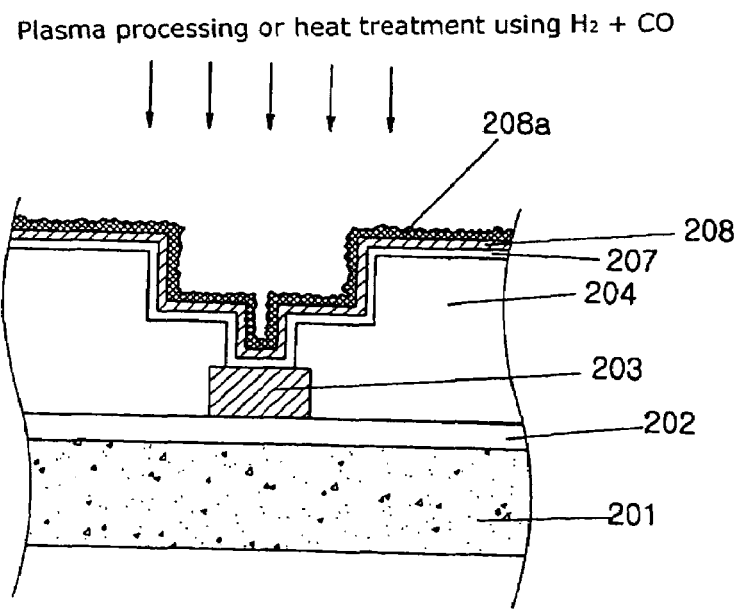

A metal barrier 207 is formed on the second insulating layer 204 that is in contact with the first conductive line 203 through the trench 206 and the via hole 205, as shown in FIG. 2b. The metal barrier 207 is formed by Ti or TiN CVD, or Ta or TaN sputtering.

Figure 2C:
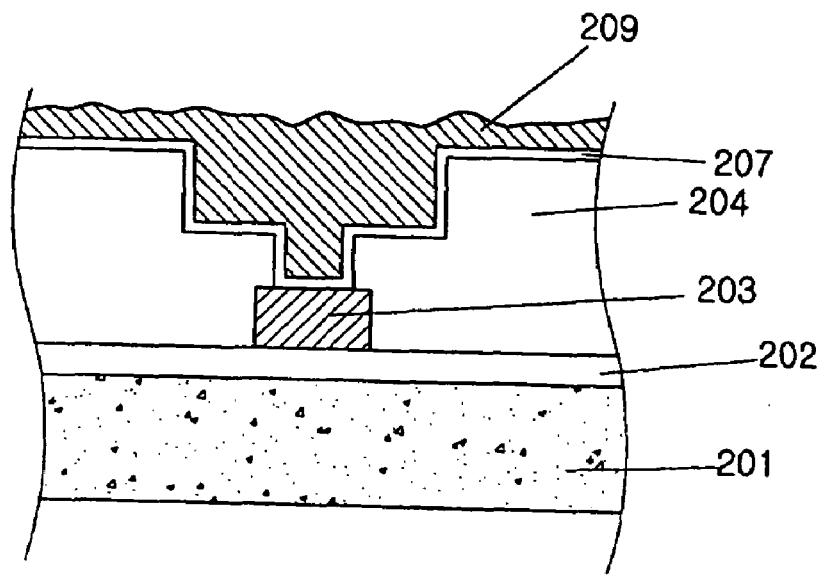

A conductive layer is then formed to simultaneously form a second conductive line and a plug on the metal barrier 207, as shown in FIG. 2c. The conductive layer is formed of Cu and can be deposited by an electroplating method.

When the copper layer 209 is formed using the electroplating method having excellent burying characteristic and physical property, a Cu seed layer 208 for forming a Cu bulk layer is first formed on the metal barrier by sputtering or PVD process, as shown in FIG. 2b. The Cu bulk layer 209 is formed to sufficiently fill the contact hole and the trench by the electroplating method using the Cu seed layer 208.

As shown in FIG. 2b, a second copper oxide layer 208a is formed on the copper seed layer 208 due to an oxidation atmosphere that is present in a chamber, after forming the copper seed layer 208 and before forming the copper bulk layer 209. The second copper oxide layer 208a should be removed because it can interfere with the growth of the copper bulk layer 209 and reduce crystallization thereof.

The copper seed layer 208 and the second copper oxide layer 208a can cause a degradation of the characteristics of the metal barrier 207 because the thickness of the layers 208 and 208a is so thin, which can cause the metal barrier to become crystallized upon a high temperature heat treatment.

To remove the second copper oxide layer 208a formed on the copper seed layer 208, a plasma-processing or a heat treatment using $H_2$+CO gas atmosphere can be performed. The second copper oxide layer 208a on the copper seed layer 208 can be removed by deoxidizing the second copper oxide layer 208a through plasma-processing using $H_2$+CO gas at room temperature or heat treatment using $H_2$+CO gas at room temperature to 200° C.

Figure 2D:
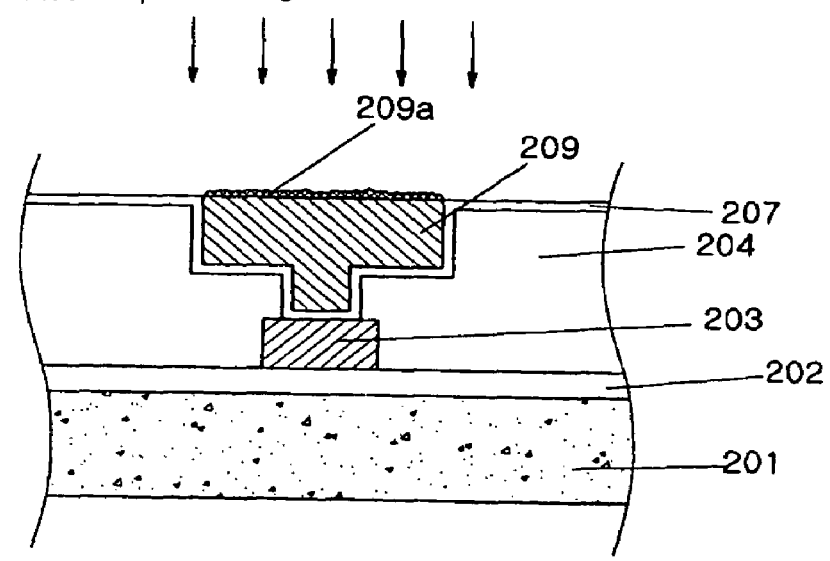

The Cu bulk layer 209 is form to sufficiently fill the contact hole (or via hole 205) and the trench 206. The layer 209 is then planarized to expose the barrier metal 207 above the second insulating layer 204, thus forming the second conductive line 209, as shown in FIG. 2d. The upper conductive line 205 is electrically connected to the first conductive line 203, without a separate patterning process. The planarizing process can be performed by chemical mechanical polishing (CMP) process.

After the CMP process and the surface cleaning process for the copper bulk layer 209, a third copper oxide layer 209a forms on the second conductive line 209. This increases resistance of the copper conductive line 209 and also degrades reliability of the conductive line. When a via hole 205 and a copper plug, positioned at other layer and to be connected the second conductive line 209, have been formed, the third copper oxide layer 209a on the second conductive line 209 increases via resistance between the via hole and the copper plug. Furthermore, it induce an insulation between via holes.

To remove the third copper oxide layer 209a on the second conductive line 209, the third copper oxide layer 209a on the second conductive line 209 can be removed by deoxidizing the third copper oxide layer 209a through plasma-processing using $H_2$+CO gas at room temperature or heat treatment using $H_2$+CO gas at room temperature to 200° C.

The method of manufacturing semiconductor devices in accordance with the preferred embodiments described above, has numerous benefits.

The copper oxide layer 203a formed on the first conductive line 209, the copper oxide layer 208a formed on the copper seed layer 208, and the copper oxide layer 209a formed on the copper conductive line after 209 CMP process of the copper conductive line 209 are effectively removed by a room temperature or low temperature process.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising:

forming a first insulating layer on a semiconductor substrate;

forming a conductive line by depositing a conductive material on the first insulating layer and selectively patterning the conductive material;

forming a second insulating layer by depositing an insulating material on top of the substrate including on the first conductive line;

forming a via hole and a trench by selectively patterning the second insulating layer to expose a certain portion of the first conductive line;

removing a natural oxide layer, formed on the first conductive line through natural oxidation of the first conductive line, by heat treating in an $H_2$+CO gas atmosphere;

forming a metal barrier by depositing a metal layer on top of the substrate including in the via hole and on the trench;

forming a copper seed layer on top of the metal barrier;

removing a natural copper oxide layer, formed on the copper seed layer through natural oxidation of the copper seed layer, by heat treating in an $H_2$+CO gas atmosphere;

depositing a conductive material for forming a conductive line on top of the substrate including on the metal barrier and the copper seed layer to sufficiently fill the via hole and the trench;

forming a plug and a second conductive line by planarizing the conductive material on the second insulating layer in order to expose the second insulating layer; and removing a natural oxide layer, formed on the second conductive line through natural oxidation of the second conductive line, by heat treating in an $H_2$+CO gas atmosphere.

2. The method of claim 1, wherein the second conductive line is formed of copper.

3. The method of claim 1, wherein the heat treatment is performed at room temperature to 200 C.

* * * * *